(12) United States Patent
Ko

(10) Patent No.: US 12,557,329 B2
(45) Date of Patent: Feb. 17, 2026

(54) PILLAR STRUCTURE AND SUPER JUNCTION SEMICONDUCTOR DEVICE INCLUDING THE SAME

(71) Applicant: DB HITEK CO., LTD., Seoul (KR)

(72) Inventor: Jong Hwan Ko, Incheon (KR)

(73) Assignee: DB HITEK CO., LTD., Seoul (KR)

( * ) Notice: Subject to any disclaimer, the term of this patent is extended or adjusted under 35 U.S.C. 154(b) by 453 days.

(21) Appl. No.: 18/098,660

(22) Filed: Jan. 18, 2023

(65) Prior Publication Data

US 2023/0231048 A1 Jul. 20, 2023

(30) Foreign Application Priority Data

Jan. 20, 2022 (KR) ........................ 10-2022-0008733

(51) Int. Cl.
| | | |
|---|---|---|
| *H01L 29/78* | (2006.01) | |
| *H01L 21/266* | (2006.01) | |
| *H10D 30/65* | (2025.01) | |
| *H10D 62/10* | (2025.01) | |
| *H10D 64/27* | (2025.01) | |

(52) U.S. Cl.
CPC ........... *H10D 30/65* (2025.01); *H01L 21/266* (2013.01); *H10D 62/124* (2025.01); *H10D 64/518* (2025.01)

(58) Field of Classification Search
CPC .... H10D 30/65; H10D 62/124; H10D 64/518; H10D 30/0281; H10D 62/371; H10D 64/112; H10D 62/157; H10D 64/516; H10D 62/109; H10D 62/126; H10D 62/393; H01L 21/266
See application file for complete search history.

(56) References Cited

U.S. PATENT DOCUMENTS

| | | | |
|---|---|---|---|
| 8,575,693 B1 * | 11/2013 | Huang | ................. H10D 64/517 257/341 |
| 2013/0020632 A1 * | 1/2013 | Disney | ............... H10D 30/0285 257/E21.409 |
| 2014/0306285 A1 | 10/2014 | Kim et al. | |

FOREIGN PATENT DOCUMENTS

KR 1020100115027 A 10/2010

OTHER PUBLICATIONS

Office Action issued Aug. 17, 2025, for Korean Application No. 10-2022-0008733 filed Jan. 20, 2022, 5 pages.

\* cited by examiner

*Primary Examiner* — Mohammed R Alam
(74) *Attorney, Agent, or Firm* — Husch Blackwell

(57) ABSTRACT

A circular LDMOS device includes a lower drift layer disposed on a substrate, a drain region disposed on the lower drift layer, a source region having a circular ring shape surrounding the drain region and spaced apart from the drain region, a field insulating layer disposed between the drain region and the source region, and an upper drift layer disposed between the lower drift layer and the field insulating layer and having a conductivity type different from that of the lower drift layer.

18 Claims, 10 Drawing Sheets

PILLAR STRUCTURE AND SUPER JUNCTION SEMICONDUCTOR DEVICE INCLUDING THE SAME

CROSS-REFERENCE TO RELATED APPLICATION

This application claims the priority benefit of Korean Patent Application No. 10-2022-0008733, filed on Jan. 20, 2022, and all the benefits accruing therefrom under 35 U.S.C. § 119, the contents of which are incorporated by reference in their entirety.

TECHNICAL FIELD

The present disclosure relates to a high voltage semiconductor device and a method of manufacturing the same. More specifically, the present disclosure relates to a circular Lateral Double Diffused Metal Oxide Semiconductor (hereinafter referred to as LDMOS) device and a method of manufacturing the same.

BACKGROUND

In general, an LDMOS device used as a high voltage semiconductor device may have advantages such as fast switching speed, high input impedance, and low power consumption, and the like, and may be widely used in various power devices such as display driving ICs, power converters, motor controllers, and automotive power supplies. The LDMOS device may include a drift layer extending in a lateral direction between a channel region and a drain region, and the on-resistance and breakdown voltage of the LDMOS device may be determined by the length of the drift layer and the impurity concentration.

For example, a circular LDMOS device may include a drift layer formed on a substrate, a drain region formed on a central portion of the drift layer, a circular ring-shaped body region formed to surround the drift layer, and a circular ring-shaped source region formed on the body region. The on-resistance of the circular LDMOS device may be reduced by increasing the impurity concentration of the drift layer, and the breakdown voltage of the circular LDMOS device may be increased by making the drift layer sufficiently depleted.

SUMMARY

The present disclosure provides a circular LDMOS device with reduced on-resistance and increased breakdown voltage and a method of manufacturing the same.

In accordance with an aspect of the present disclosure, a circular LDMOS device may include a lower drift layer disposed on a substrate, a drain region disposed on the lower drift layer, a source region having a circular ring shape surrounding the drain region and spaced apart from the drain region, a field insulating layer disposed between the drain region and the source region, and an upper drift layer disposed between the lower drift layer and the field insulating layer and having a conductivity type different from that of the lower drift layer.

In accordance with some embodiments of the present disclosure, the circular LDMOS device may further include an epitaxial disposed on the substrate and having a same conductivity type as the lower drift layer. In such case, the substrate may have the same conductivity type as the upper drift layer, and the lower drift layer may be disposed on the epitaxial layer.

In accordance with some embodiments of the present disclosure, each of the field insulating layer and the upper drift layer may have a circular ring shape, and each of the lower drift layer and the epitaxial layer may have a disk shape.

In accordance with some embodiments of the present disclosure, the circular LDMOS device may further include a first well region having a circular ring shape surrounding the upper drift layer and having a same conductivity type as the upper drift layer, and a second well region disposed on the lower drift layer and having a same conductivity type as the lower drift layer. In such case, the source region may be disposed on the first well region, and the drain region may be disposed on the second well region.

In accordance with some embodiments of the present disclosure, the upper drift layer and the first well region may be spaced apart from each other by a predetermined interval.

In accordance with some embodiments of the present disclosure, the circular LDMOS device may further include a third well region disposed in the first well region and having a same conductivity type as the first well region, and a well contact region disposed on the third well region and having a same conductivity type as the third well region.

In accordance with some embodiments of the present disclosure, the circular LDMOS device may further include a deep well region disposed below the first well region and having a same conductivity type as the first well region, and a buried layer disposed below the deep well region and having a same conductivity type as the deep well region.

In accordance with some embodiments of the present disclosure, the buried layer may include a ring region having a circular ring shape and a plurality of protrusions protruding inward from the ring region.

In accordance with some embodiments of the present disclosure, the circular LDMOS device may further include a deep well region disposed below the first well region and having a same conductivity type as the first well region, a first buried layer disposed below the deep well region and having a circular ring shape and a same conductivity type as the deep well region, and a second buried layer disposed inside the first buried layer and having a circular ring shape and a same conductivity type as the first buried layer. In such case, the second buried layer may have an impurity concentration lower than that of the first buried layer.

In accordance with some embodiments of the present disclosure, the circular LDMOS device may further include a first field electrode disposed on the field insulating layer and having a circular ring shape.

In accordance with some embodiments of the present disclosure, the circular LDMOS device may further include a plurality of second field electrodes having a circular ring shape surrounding the first field electrode and arranged in a concentric circle shape.

In accordance with some embodiments of the present disclosure, the first field electrode may be electrically connected to the drain region, and the second field electrodes may be electrically floated.

In accordance with another aspect of the present disclosure, a method of manufacturing a circular LDMOS device may include forming a lower drift layer on a substrate, forming an upper drift layer having a circular ring shape on the lower drift layer, the upper drift layer having a conductivity type different from that of the lower drift layer, forming a field insulating layer having a circular ring shape on the upper drift layer, forming a drain region inside the field insulating layer, and forming a source region having a circular ring shape surrounding the field insulating layer.

In accordance with some embodiments of the present disclosure, the method may further include forming an epitaxial layer having a same conductivity type as the lower drift layer on the substrate. In such case, the substrate may have a same conductivity type as the upper drift layer, and the lower drift layer may be formed on the epitaxial layer.

In accordance with some embodiments of the present disclosure, the method may further include forming a first well region having a circular ring shape surrounding the upper drift layer and having a same conductivity type as the upper drift layer, and forming a second well region having a same conductivity type as the lower drift layer on the lower drift layer. In such case, the source region may be formed on the first well region, and the drain region may be formed on the second well region.

In accordance with some embodiments of the present disclosure, the method may further include forming a buried layer having a circular ring shape on the substrate, the buried layer having a same conductivity type as the upper drift layer, and forming a deep well region having a circular ring shape on the buried layer, the deep well region having a same conductivity type as the upper drift layer. In such case, the first well region may be formed on the deep well region.

In accordance with some embodiments of the present disclosure, the buried layer may be formed by an ion implantation process using an ion implantation mask. In such case, the ion implantation mask may have a plurality of openings arranged in a circular ring shape, and the openings may have a width that gradually decreases in an inward direction.

In accordance with some embodiments of the present disclosure, the method may further include forming a first buried layer having a circular ring shape on the substrate, the first buried layer having a same conductivity type as the upper drift layer, forming a second buried layer having a circular ring shape inside the first buried layer, the second buried layer having a same conductivity type as the upper drift layer, and forming a deep well region having a circular ring shape on the first buried layer, the deep well region having a same conductivity type as the upper drift layer. In such case, the first well region may be formed on the deep well region, and the second buried layer may have an impurity concentration lower than that of the first buried layer.

In accordance with some embodiments of the present disclosure, the method may further include forming a first field electrode having a circular ring shape on the field insulating layer.

In accordance with some embodiments of the present disclosure, the method may further include forming a plurality of second field electrodes on the field insulating layer, the plurality of second field electrodes having a circular ring shape surrounding the first field electrode and arranged in a concentric circle shape. In such case, the first field electrode may be electrically connected to the drain region and the second field electrodes may be electrically floated.

In accordance with the embodiments of the present disclosure as described above, the substrate may have the first conductivity type, the epitaxial layer and the lower drift layer may have the second conductivity type, and the upper drift layer may have the first conductivity type. As a result, the lower drift layer may be sufficiently depleted, thereby improving the breakdown voltage of the circular LDMOS device. In addition, by forming the upper drift layer, it may be allowed to increase the impurity concentration of the lower drift layer, and accordingly, the on-resistance of the circular LDMOS device may be reduced. In particular, the concentration ratio between the N-type impurities and the P-type impurities may be appropriately controlled using the protrusions of the buried layer protruding toward a center of the circular LDMOS device, and thus, the breakdown voltage of the circular LDMOS device may be more sufficiently improved.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Embodiments can be understood in more detail from the following description taken in conjunction with the accompanying drawings, in which.

Figure 1:
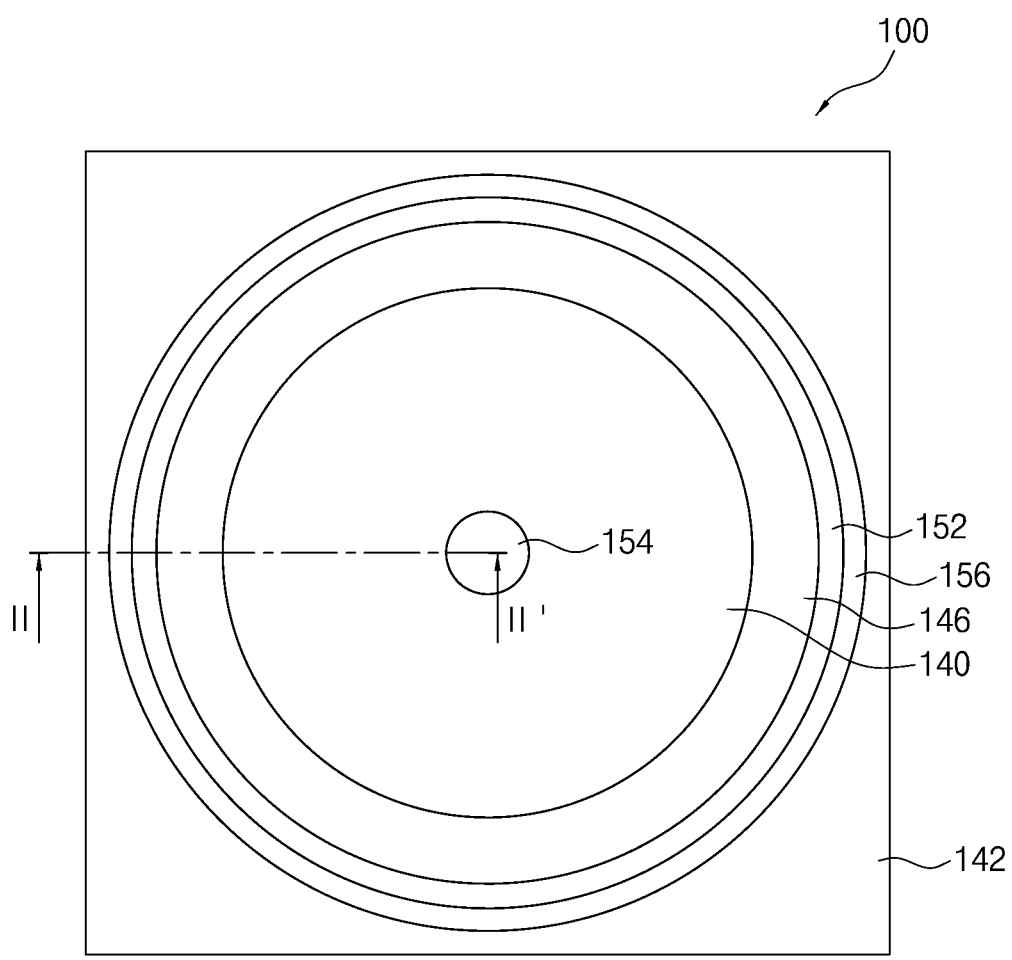
FIG. 1 is a schematic plan view illustrating a circular LDMOS device in accordance with an embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Figure 2:
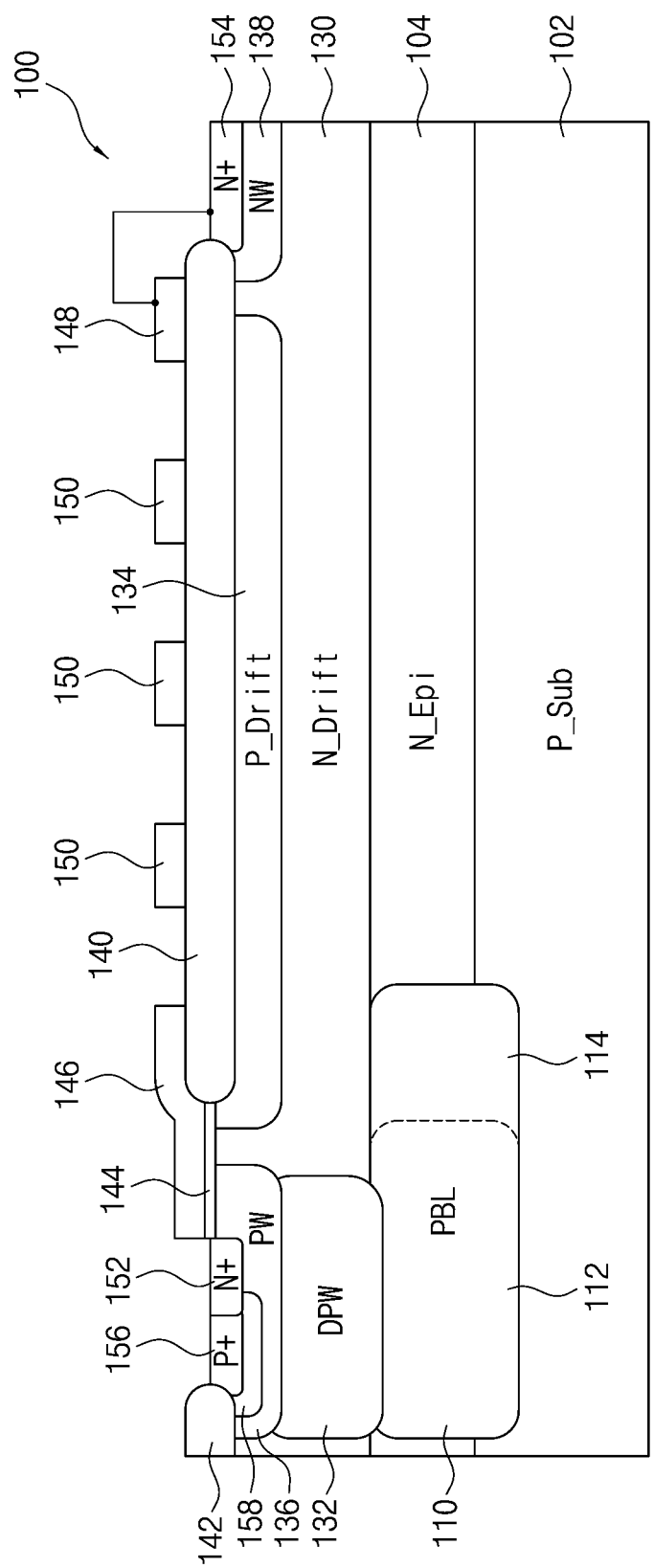
FIG. 2 is a schematic cross-sectional view taken along a line II-II' as shown in FIG. 1.

FIG. 1 is a schematic plan view illustrating a circular LDMOS device in accordance with an embodiment of the present disclosure, and FIG. 2 is a schematic cross-sectional view taken along a line II-II' as shown in FIG. 1.

Referring to FIGS. 1 and 2, a circular LDMOS device 100, in accordance with an embodiment of the present disclosure, may include a lower drift layer 130 formed on a substrate 102, a drain region 154 formed on the lower drift layer 130, a source region 152 having a circular ring shape surrounding the drain region 154 and spaced apart from the drain region 154, a field insulating layer 140 formed between the drain region 154 and the source region 152, and an upper drift layer 134 formed between the lower drift layer 130 and the field insulating layer 140 and having a conductivity type different from that of the lower drift layer 130.

The circular LDMOS device 100 may include an epitaxial layer 104 formed on the substrate 102, and the lower drift layer 130 may be formed on the epitaxial layer 104. In particular, the substrate 102 may have a first conductivity type, and the epitaxial layer 104 and the lower drift layer 130 may have a second conductivity type. For example, the substrate 102 may be a P-type substrate, and an N-type epitaxial layer 104 may be formed on the P-type substrate 102. Further, an N-type impurity region functioning as the lower drift layer 130 may be formed on the N-type epitaxial layer 104. The N-type epitaxial layer 104 may be formed on the P-type substrate 102 by an epitaxial growth process, and the lower drift layer 130 may be formed by implanting N-type impurities into the N-type epitaxial layer 104 by an ion implantation process.

The upper drift layer 134 may be formed on the lower drift layer 130. The upper drift layer 134 may have the first conductivity type to sufficiently deplete the lower drift layer 130. For example, the upper drift layer 134 may be a P-type impurity region, and may be formed by implanting P-type impurities into an upper portion of the lower drift layer 130 by an ion implantation process. In particular, it may be allowed to increase the impurity concentration of the lower drift layer 130 compared to the prior art by forming the upper drift layer 134, and accordingly, the on-resistance of the circular LDMOS device 100 may be reduced.

The circular LDMOS device 100 may include a first well region 136 having a circular ring shape surrounding the upper drift layer 134, and a second well region 138 formed on a central portion of the lower drift layer 130. In such case, the upper drift layer 134 may be formed in a circular ring shape between the first well region 136 and the second well region 138. The first well region 136 may have the same conductivity type as the upper drift layer 134, that is, the first conductivity type, and the second well region 138 may have the same conductivity type as the lower drift layer 130, that is, the second conductivity type.

For example, the first well region 136 may be a P-type impurity region, and the second well region 138 may be an N-type impurity region. The first well region 136 may be formed to have a circular ring shape on an upper portion of an edge portion of the lower drift layer 130 through an ion implantation process, and the second well region 138 may be formed on an upper portion of a central portion of the lower drift layer 130 through an ion implantation process. In this case, the lower drift layer 130 may have an impurity concentration higher than the epitaxial layer 104, and the second well region 138 may have an impurity concentration higher than the lower drift layer 130.

The source region 152 may be formed on the first well region 136, and the drain region 154 may be formed on the second well region 138. The source region 152 and the drain region 154 may have the second conductivity type. For example, the source region 152 may be formed by implanting N-type impurities into an upper portion of the first well region 136 through an ion implantation process, and the drain region 154 may be formed by implanting N-type impurities into an upper portion of the second well region 138.

In addition, a well contact region 156 may be formed on the first well region 136. The well contact region 156 may have the first conductivity type and may be formed in a circular ring shape surrounding the source region 152.

Alternatively, as shown in FIG. 2, a third well region 158 having the first conductivity type may be formed in the first well region 136, and the well contact region 156 may be formed on the third well region 158. For example, the third well region 158 may be formed by implanting P-type impurities into the first well region 136 through an ion implantation process, and the well contact region 156 may be formed by implanting P-type impurities into an upper portion of the third well region 158 through an ion implantation process. As a result, the third well region 158 may have an impurity concentration higher than the first well region 136, and the well contact region 156 may have an impurity concentration higher than the third well region 158.

In accordance with an embodiment of the present disclosure, a deep well region 132 having the same conductivity type as the first well region 136, that is, the first conductivity type, may be formed below the first well region 136. A buried layer 110 having the same conductivity type as the deep well region 132, that is, the first conductivity type, may be formed below the deep well region 132. The deep well region 132 may be used for device isolation, and the buried layer 110 may be used to fully deplete the lower drift layer 130 and the epitaxial layer 104.

For example, the deep well region 132 may have a circular ring shape surrounding the lower drift layer 130 and may be a P-type impurity region formed through an ion implantation process. The buried layer 110 may have a circular ring shape surrounding the epitaxial layer 104 and may be a P-type impurity region formed through an ion implantation process. As a result, the epitaxial layer 104 may have a substantially disk shape defined by the buried layer 110, and the lower drift layer 130 may have a substantially disk shape defined by the first well region 136 and the deep well region 132.

Figure 3:
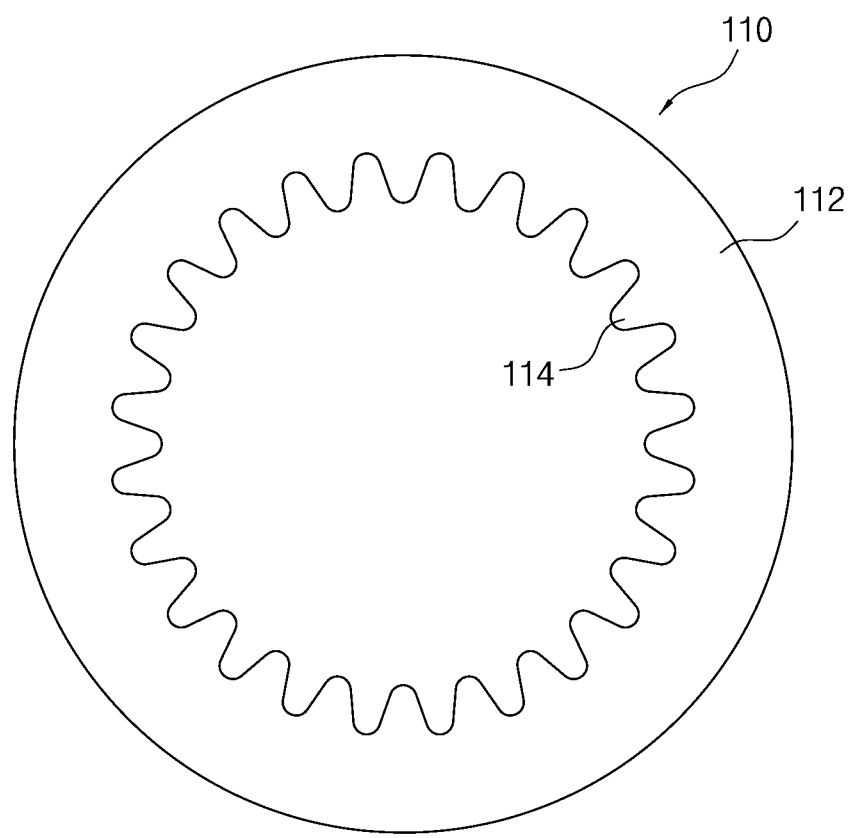
FIG. 3 is a schematic plan view illustrating a buried layer as shown in FIG. 2.
Figure 4:
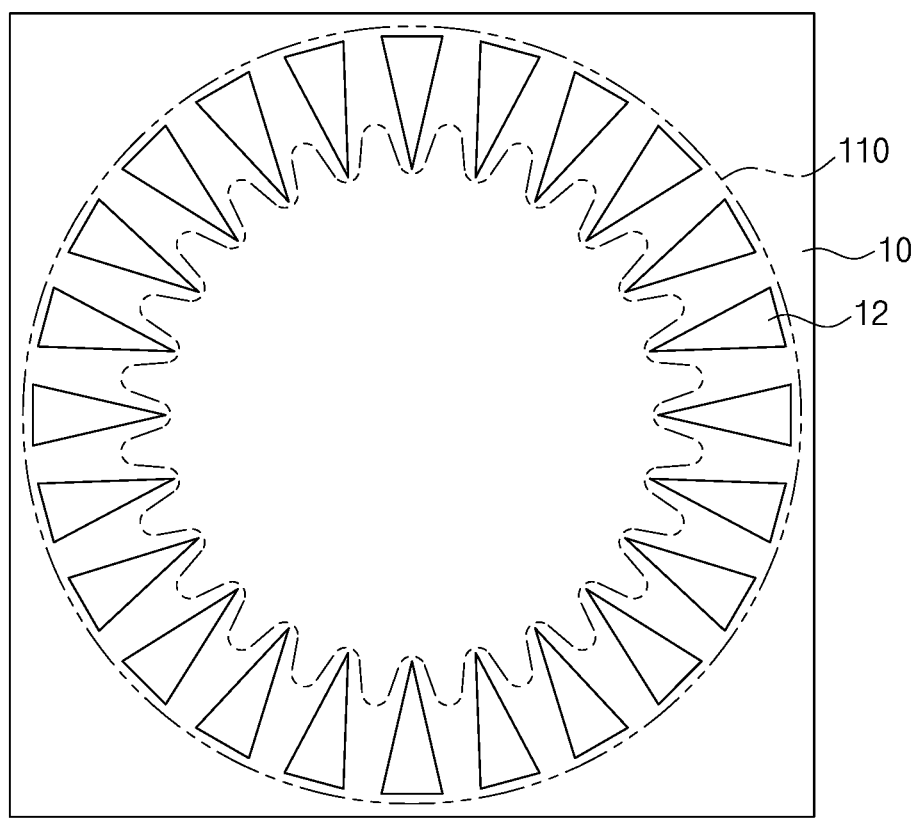
FIG. 4 is a schematic plan view illustrating an ion implantation mask for forming the buried layer as shown in FIG. 3.

FIG. 3 is a schematic plan view illustrating the buried layer as shown in FIG. 2, and FIG. 4 is a schematic plan view illustrating an ion implantation mask for forming the buried layer as shown in FIG. 3.

Referring to FIG. 3, the buried layer 110 may have a substantially circular ring shape. Particularly, the buried layer 110 may include a ring region 112 having a circular ring shape and a plurality of protrusions 114 protruding inward from the ring region 112. The buried layer 110 may be used to fully deplete the lower drift layer 130 and the epitaxial layer 104. Further, the buried layer 110 may be used to prevent an electric field from being concentrated in the source region 152 or a region adjacent to the source region 152. Particularly, the protrusions 114 may be used to adjust the concentration ratio between N-type impurities of the epitaxial layer 104 and the lower drift layer 130, and P-type impurities of the substrate 102, the upper drift layer 134, and the buried layer 110.

As described above, the concentration ratio between the N-type impurities and the P-type impurities may be appropriately adjusted by the protrusions 114 of the buried layer 110, and accordingly, the concentration of the electric field in the source region 152 or the region adjacent to the source region 152 may be prevented. As a result, the breakdown voltage of the circular LDMOS device 100 may be significantly increased.

The buried layer 110 may be formed through an ion implantation process using an ion implantation mask 10. For example, as shown in FIG. 4, the ion implantation mask 10 for performing the ion implantation process may have a plurality of openings 12 arranged in a circular ring shape. Particularly, the openings 12 may have a width that gradually decreases in an inward direction. Specifically, during the ion implantation process, P-type impurities may be implanted into the substrate 102 and the epitaxial layer 104 through the openings 12, and P-type impurity regions formed by the ion implantation process may be connected to each other in the substrate 102 and the epitaxial layer 104. As a result, the buried layer 110 having the plurality of protrusions 114 protruding in the inward direction may be formed in the substrate 102 and the epitaxial layer 104.

Figure 5:
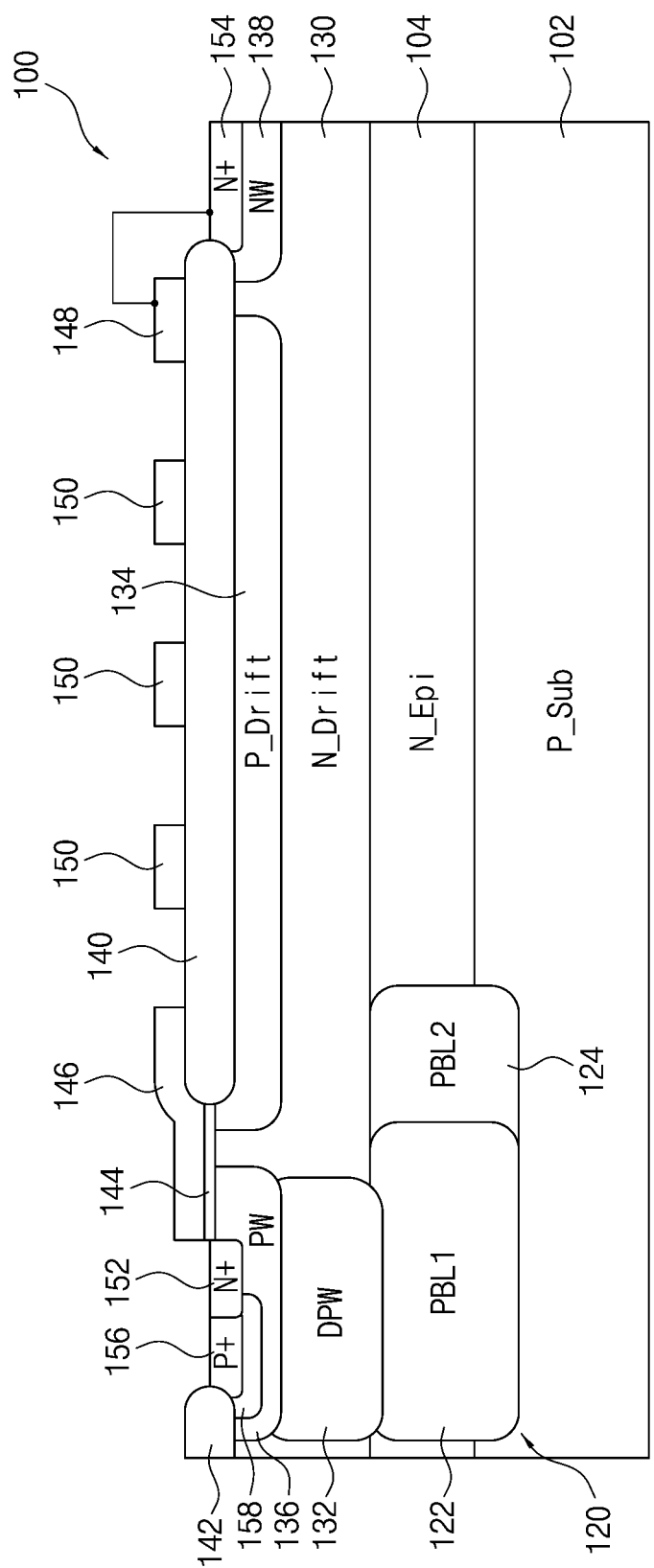
FIG. 5 is a schematic cross-sectional view illustrating another example of the buried layer as shown in FIG. 2.

FIG. 5 is a schematic cross-sectional view illustrating another example of the buried layer as shown in FIG. 2.

Referring to FIG. 5, a buried layer 120 having the same conductivity type as the deep well region 132, that is, the first conductivity type, may be formed below the deep well region 132. Specifically, the buried layer 120 may include a first buried layer 122 formed below the deep well region 132 and having a circular ring shape and the same conductivity type as the deep well region 132, and a second buried layer 124 formed inside the first buried layer 122 and having a circular ring shape and the same conductivity type as the first buried layer 122. For example, the second buried layer 124 may be formed on an inner side surface of the first buried layer 122. In particular, the second buried layer 124 may have an impurity concentration lower than the first buried layer 122.

Referring again to FIGS. 1 and 2, the field insulating layer 140 may be formed between the source region 152 and the drain region 154. Particularly, an outer portion of the field insulating layer 140 may be formed on the upper drift layer 134 to be spaced apart from the first well region 136 by a predetermined distance, and an inner portion of the field insulating layer 140 may be formed on an edge portion of the second well region 138.

For example, the field insulating layer 140 may be formed in a circular ring shape through a LOCOS (Local Oxidation of Silicon) process. An outer portion of the upper drift layer 134 may be spaced apart from the first well region 136 by a predetermined distance, and an inner portion of the upper drift layer 134 may be spaced apart from the second well region 138 by a predetermined distance. Therefore, as shown in FIG. 2, the field insulating layer 140 may be formed in a circular ring shape on the upper drift layer 134, a portion of the lower drift layer 130 between the upper drift layer 134 and the second well region 138, and an outer portion of the second well region 138. In such case, the drain region 154 may be formed inside the field insulating layer 140 as shown in FIG. 2.

The circular LDMOS device 100 may include a device isolation layer 142 surrounding the well contact region 156. For example, the device isolation layer 142 may be formed simultaneously with the field insulating layer 140. Alternatively, although not shown in figures, the circular LDMOS device 100 may include a device isolation region (not shown) surrounding the well contact region 156. In such case, the device isolation region may be formed through a shallow trench isolation (STI) process.

Further, a gate insulating layer 144 may be formed on an inner portion of the first well region 136, an outer portion of the lower drift layer 130, and an outer portion of the upper drift layer 134. A gate electrode 146 may be formed on an outer portion of the field insulating layer 140 and the gate insulating layer 144.

A first field electrode 148 having a circular ring shape may be formed on an inner portion of the field insulating layer 140. Further, a plurality of second field electrodes 150 having a circular ring shape surrounding the first field electrode 148 and arranged in a concentric circle shape may be formed on the field insulating layer 140. The first field electrode 148 and the second field electrodes 150 may be formed to prevent an electric field from being concentrated in the drain region 154 or a region adjacent to the drain region 154. Particularly, the first field electrode 148 may be electrically connected to the drain region 154 and the second field electrodes 150 may be electrically floated.

FIGS. 6 to 10 are schematic cross-sectional views illustrating a method of manufacturing the circular LDMOS device as shown in FIGS. 1 and 2.

Figure 6:
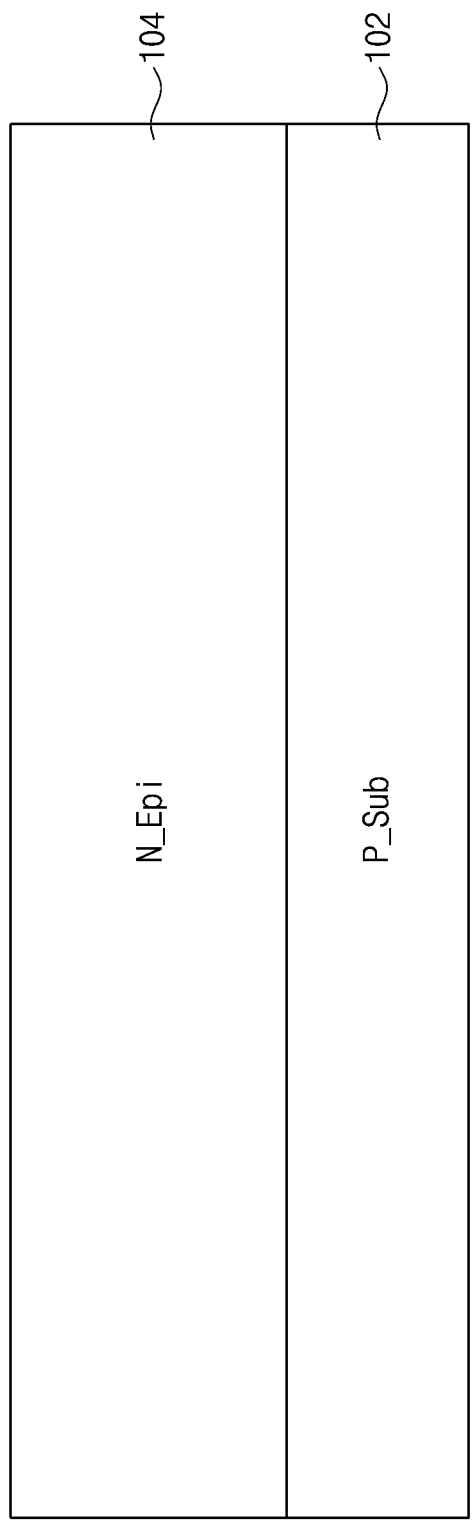
FIGS. 6 to 10 are schematic cross-sectional views illustrating a method of manufacturing the circular LDMOS device as shown in FIGS. 1 and 2.

Referring to FIG. 6, an epitaxial layer 104 may be formed on a substrate 102. For example, the substrate 102 may have a first conductivity type and the epitaxial layer 104 may have a second conductivity type. Specifically, an N-type epitaxial layer 104 may be formed on a P-type silicon substrate 102 through an epitaxial growth process.

Figure 7:
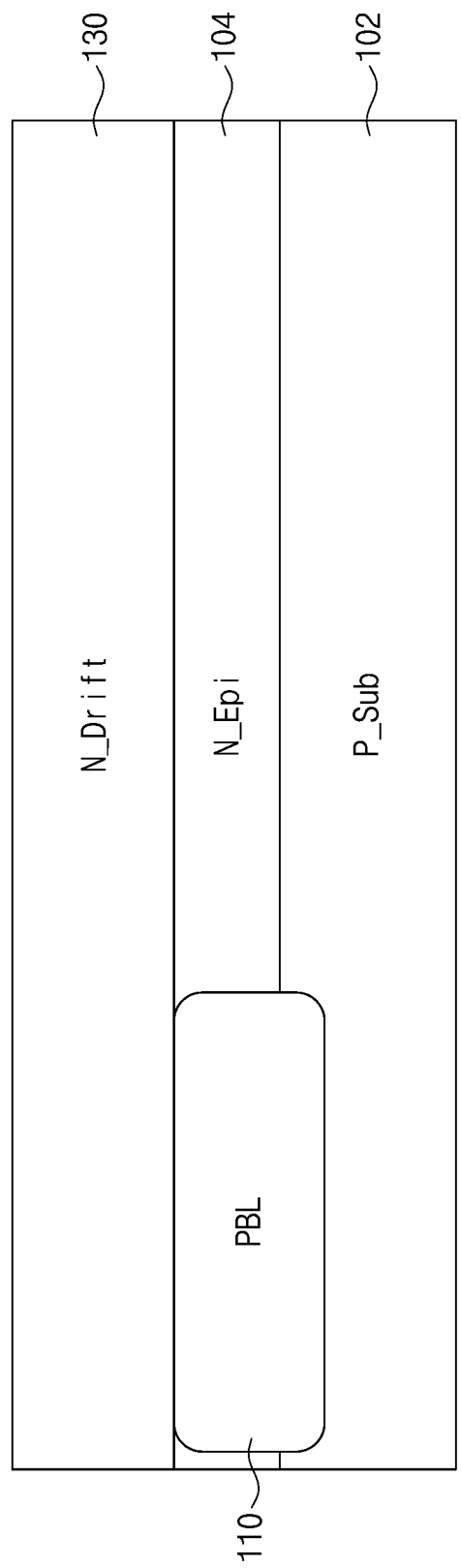

Referring to FIG. 7, a buried layer 110 having a circular ring shape and surrounding the epitaxial layer 104 may be formed on the substrate 102. For example, the buried layer 110 may have the first conductivity type, and may be formed by implanting P-type impurities into a surface portion of the substrate 102 and the epitaxial layer 104 through an ion implantation process. The ion implantation process may be performed using the ion implantation mask 10 shown in FIG. 4. For example, as shown in FIG. 2, the buried layer 110 may include a ring region 112 having a circular ring shape and a plurality of protrusions 114 protruding inward from the ring region 112. That is, the protrusions 114 may protrude toward a center of the ring region 112.

As another example, as shown in FIG. 5, a first buried layer 122 having a circular ring shape and the first conductivity type may be formed on the substrate 102, and a second buried layer 124 having a circular ring shape and the first conductivity type may be formed inside the first buried layer 122. In such case, the second buried layer 124 may have an impurity concentration lower than the first buried layer 122.

Further, a lower drift layer 130 may be formed on the epitaxial layer 104. For example, the lower drift layer 130 may have the second conductivity type, and may be formed by implanting N-type impurities into the epitaxial layer 104 through an ion implantation process.

Figure 8:
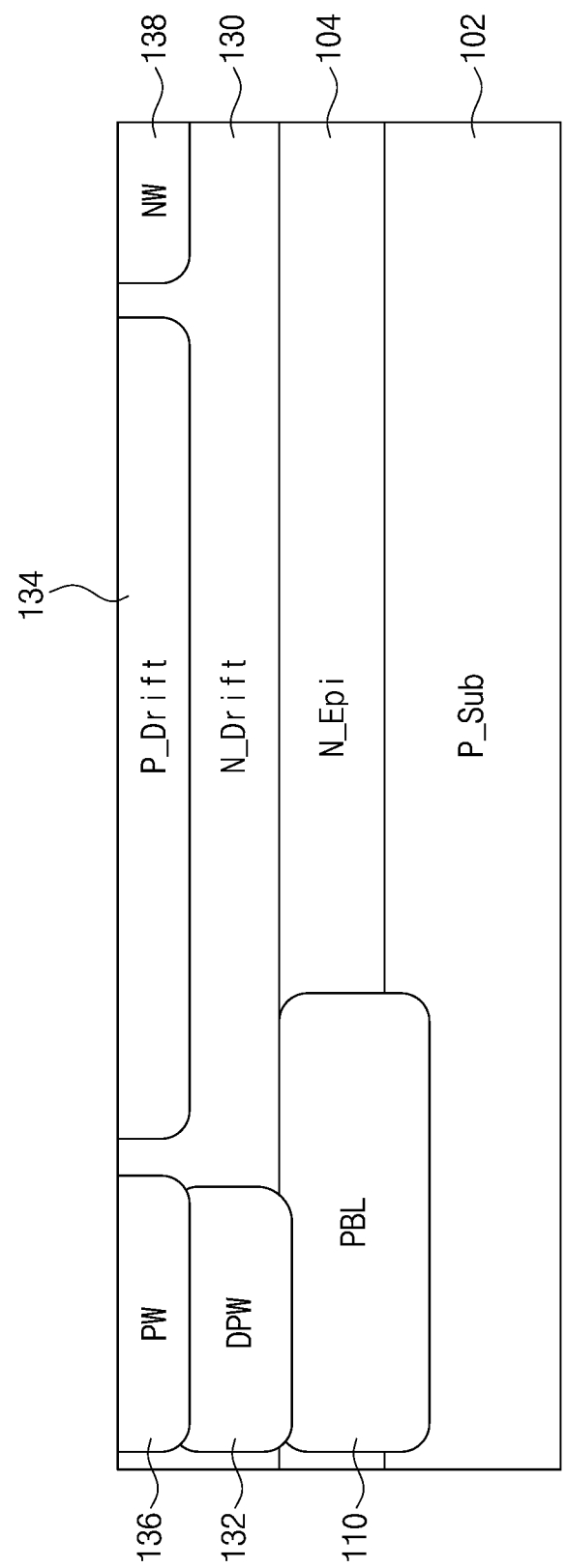

Referring to FIG. 8, a deep well region 132 having a circular ring shape may be formed on the buried layer 110. For example, the deep well region 132 may have the first conductivity type, and may be formed by implanting P-type impurities into the lower drift layer 130 through an ion implantation process.

An upper drift layer 134 having a circular ring shape may be formed on the lower drift layer 130. For example, the upper drift layer 134 may have the first conductivity type, and may be formed by implanting P-type impurities into an upper portion of the lower drift layer 130 through an ion implantation process.

A first well region 136 having a circular ring shape may be formed on the deep well region 132. For example, the first well region 136 may have the first conductivity type, and may be formed by implanting P-type impurities into an upper portion of the lower drift layer 130 through an ion implantation process.

A second well region 138 may be formed on the lower drift layer 130. For example, the second well region 138 may have the second conductivity type, and may be formed by implanting N-type impurities into an upper portion of the lower drift layer 130 through an ion implantation process.

In such case, the upper drift layer 134 may have a circular ring shape surrounding the second well region 138, and the first well region 136 may have a circular ring shape surrounding the upper drift layer 134. In addition, the upper drift layer 134 may be spaced apart from the first well region 136 by a predetermined distance, and the second well region 138 may be spaced apart from the upper drift layer 134 by a predetermined distance.

Figure 9:
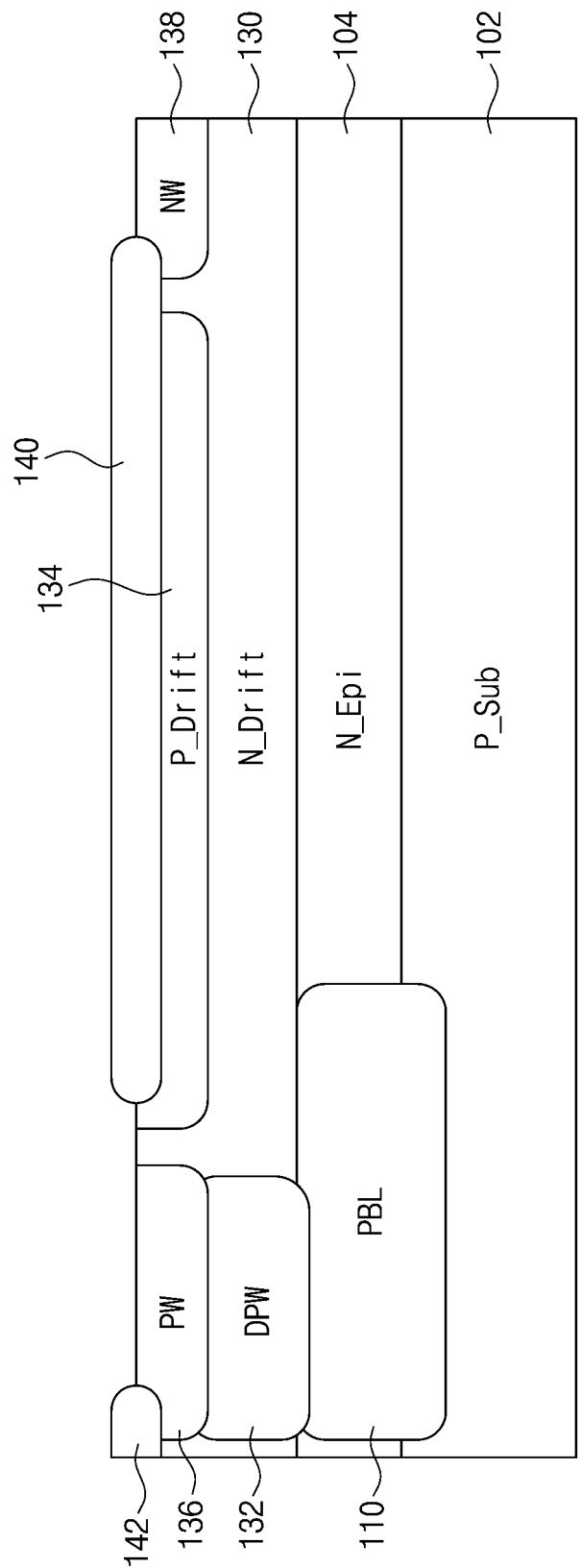

Referring to FIG. 9, a field insulating layer 140 having a circular ring shape may be formed on the upper drift layer 134, the lower drift layer 130 and the second well region 138. An outer portion of the field insulating layer 140 may be formed on the upper drift layer 134 to be spaced apart from the first well region 136 by a predetermined distance, and an inner portion of the field insulating layer 140 may be formed on an edge portion of the second well region 138.

For example, the field insulating layer 140 may be formed in a circular ring shape through a LOCOS (Local Oxidation of Silicon) process. Specifically, the field insulating layer 140 may be formed in a circular ring shape on the upper drift layer 134, a portion of the lower drift layer 130 between the upper drift layer 134 and the second well region 138, and an outer portion of the second well region 138. That is, an inner diameter of the field insulating layer 140 may be smaller than that of the upper drift layer 134, and an outer diameter of the field insulating layer 140 may be smaller than an outer diameter of the upper drift layer 134.

Meanwhile, a device isolation layer 142 may be formed to electrically isolate the circular LDMOS device 100 from adjacent devices. For example, the device isolation layer 142 may be formed simultaneously with the field insulating layer 140. As another example, the device isolation layer 142 may be formed on the epitaxial layer 104 through a LOCOS process after forming the epitaxial layer 104. As still another example, although not shown in figures, a device isolation region (not shown) may be formed in the epitaxial layer 104 through an STI process after forming the epitaxial layer 104.

Figure 10:
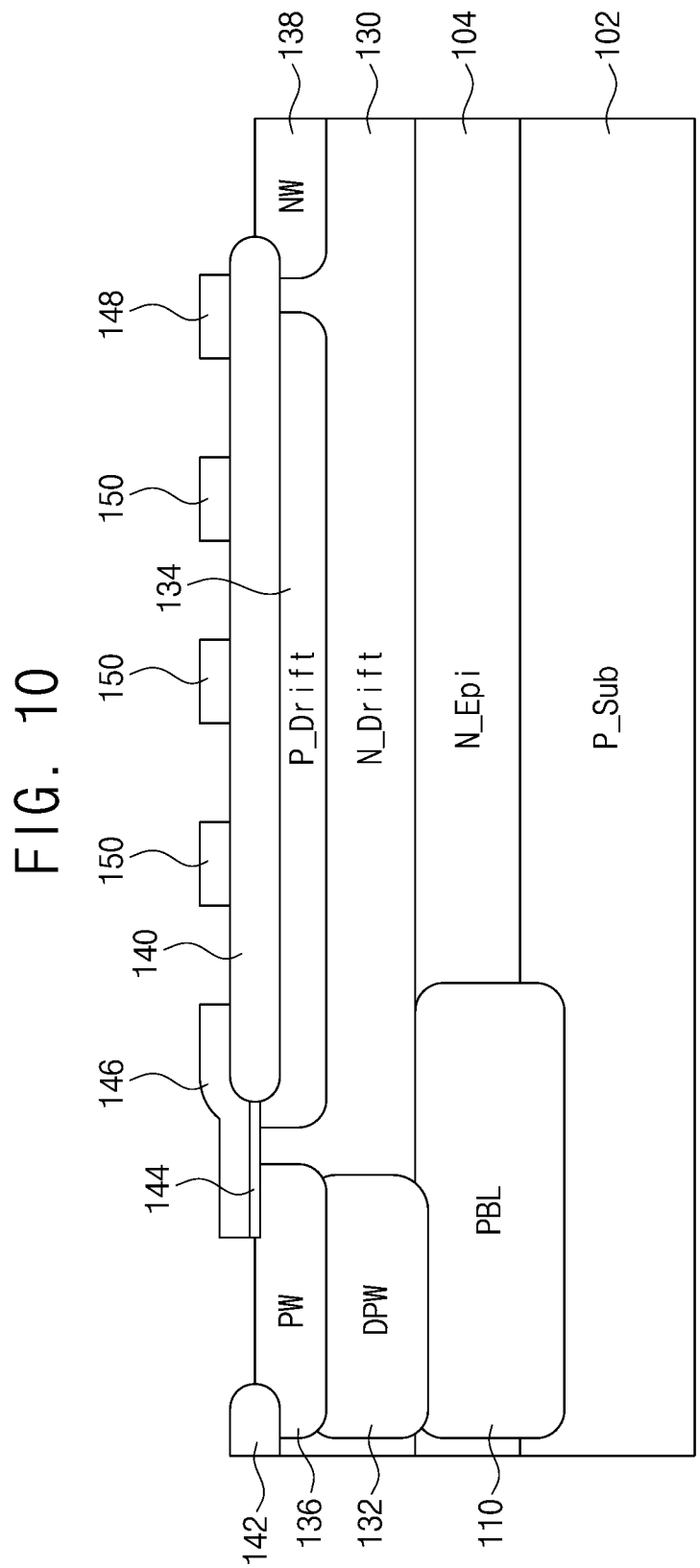

Referring to FIG. 10, a gate insulating layer 144 may be formed, and a gate electrode 146 may be formed on the gate insulating layer 144. For example, the gate insulating layer 144 may be formed through a thermal oxidation process. The gate electrode 146 may be formed by forming an impurity-doped polysilicon layer (not shown) on the gate insulating layer 144 and the field insulating layer 140 and then patterning the impurity-doped polysilicon layer. In particular, the gate electrode 146 may have a circular ring shape. Specifically, an outer portion of the gate electrode 146 may be spaced apart from the device isolation layer 142, and an inner portion of the gate electrode 146 may be disposed on an outer portion of the field insulating layer 140.

In addition, a first field electrode 148 having a circular ring shape may be formed on an inner portion of the field insulating layer 140, and a plurality of second field electrodes 150 having a circular ring shape and arranged in a concentric circle shape may be formed on the field insulating layer 140. That is, the second field electrodes 150 may be formed between the gate electrode 146 and the first field electrode 148.

The first field electrode 148 and the second field electrodes 150 may be formed simultaneously with the gate electrode 146. Although not shown in figures, spacers (not shown) made of an insulating material, for example, silicon oxide or silicon nitride, may be formed on side surfaces of the gate electrode 146, side surfaces of the first field electrode 148, and side surfaces of the second field electrodes 150.

Referring again to FIG. 2, a source region 152 having the second conductivity type may be formed on the first well region 136, and a drain region 154 having the second conductivity type may be formed on the second well region 138. The source region 152 and the drain region 154 may be formed by implanting N-type impurities into an upper portion of the first well region 136 and an upper portion of the second well region 138 through an ion implantation process, and the source region 152 may have a circular ring shape.

In addition, a well contact region 156 having the first conductivity type may be formed outside the source region 152. For example, the well contact region 156 may be formed by implanting P-type impurities into an upper portion of the first well region 136 through an ion implantation process. The well contact region 156 may be positioned between the source region 152 and the isolation layer 142 and may have a circular ring shape.

Alternatively, a third well region 158 having the first conductivity type may be formed in the first well region 136, and the well contact region 156 may be formed on the third well region 158. The third well region 158 may be formed through an ion implantation process after forming the first well region 136 or the gate electrode 146.

Although not shown in detail, the first field electrode 148 and the drain region 154 may be electrically connected to each other through a subsequent metalization process. The second field electrodes 150 may be electrically floated. That is, the second field electrodes 150 may not be connected to metal wires (not shown) formed by the metal process.

In accordance with the embodiments of the present disclosure as described above, the substrate 102 may have the first conductivity type, the epitaxial layer 104 and the lower drift layer 130 may have the second conductivity type, and the upper drift layer 134 may have the first conductivity type. As a result, the lower drift layer 130 may be sufficiently depleted, thereby improving the breakdown voltage of the circular LDMOS device 100. In addition, by forming the upper drift layer 134, it may be allowed to increase the impurity concentration of the lower drift layer 130, and accordingly, the on-resistance of the circular LDMOS device 100 may be reduced. In particular, the concentration ratio between the N-type impurities and the P-type impurities may be appropriately controlled using the protrusions 114 of the buried layer 110 protruding toward a center of the circular LDMOS device 100, and thus, the breakdown voltage of the circular LDMOS device 100 may be more sufficiently improved.

Although the example embodiments of the present disclosure have been described with reference to the specific embodiments, they are not limited thereto. Therefore, it will be readily understood by those skilled in the art that various modifications and changes can be made thereto without departing from the spirit and scope of the present disclosure defined by the appended claims.

The invention claimed is:

1. A circular LDMOS device comprising:
a lower drift layer disposed on a substrate;
a drain region disposed on the lower drift layer;
a source region having a circular ring shape surrounding the drain region and spaced apart from the drain region;
a field insulating layer disposed between the drain region and the source region;
an upper drift layer disposed between the lower drift layer and the field insulating layer and having a conductivity type different from that of the lower drift layer; and
an epitaxial layer disposed on the substrate and having a same conductivity type as the lower drift layer;
wherein the substrate has a same conductivity type as the upper drift layer, and the lower drift layer is disposed on the epitaxial layer.

2. The circular LDMOS device of claim 1, wherein each of the field insulating layer and the upper drift layer has a circular ring shape, and each of the lower drift layer and the epitaxial layer has a disk shape.

3. The circular LDMOS device of claim 1, further comprising:
a first well region having a circular ring shape surrounding the upper drift layer and having a same conductivity type as the upper drift layer; and
a second well region disposed on the lower drift layer and having a same conductivity type as the lower drift layer,
wherein the source region is disposed on the first well region, and the drain region is disposed on the second well region.

4. The circular LDMOS device of claim 3, wherein the upper drift layer and the first well region are spaced apart from each other by a predetermined interval.

5. The circular LDMOS device of claim 3, further comprising:
a third well region disposed in the first well region and having a same conductivity type as the first well region; and
a well contact region disposed on the third well region and having a same conductivity type as the third well region.

6. The circular LDMOS device of claim 3, further comprising:
a deep well region disposed below the first well region and having a same conductivity type as the first well region; and
a buried layer disposed below the deep well region and having a same conductivity type as the deep well region.

7. The circular LDMOS device of claim 6, wherein the buried layer comprises a ring region having a circular ring shape and a plurality of protrusions protruding inward from the ring region.

8. The circular LDMOS device of claim 3, further comprising:

a deep well region disposed below the first well region and having a same conductivity type as the first well region;
a first buried layer disposed below the deep well region and having a circular ring shape and a same conductivity type as the deep well region; and
a second buried layer disposed inside the first buried layer and having a circular ring shape and a same conductivity type as the first buried layer,
wherein the second buried layer has an impurity concentration lower than that of the first buried layer.

9. The circular LDMOS device of claim 1, further comprising a first field electrode disposed on the field insulating layer and having a circular ring shape.

10. The circular LDMOS device of claim 9, further comprising a plurality of second field electrodes having a circular ring shape surrounding the first field electrode and arranged in a concentric circle shape.

11. The circular LDMOS device of claim 10, wherein the first field electrode is electrically connected to the drain region and the second field electrodes are electrically floated.

12. A method of manufacturing a circular LDMOS device, the method comprising:
forming a lower drift layer on a substrate;
forming an upper drift layer having a circular ring shape on the lower drift layer, the upper drift layer having a conductivity type different from that of the lower drift layer;
forming a field insulating layer having a circular ring shape on the upper drift layer;
forming a drain region inside the field insulating layer;
forming a source region having a circular ring shape surrounding the field insulating layer; and
forming an epitaxial layer having a same conductivity type as the lower drift layer on the substrate;
wherein the substrate has a same conductivity type as the upper drift layer, and the lower drift layer is formed on the epitaxial layer.

13. The method of claim 12, further comprising:
forming a first well region having a circular ring shape surrounding the upper drift layer and having a same conductivity type as the upper drift layer; and
forming a second well region having a same conductivity type as the lower drift layer on the lower drift layer,
wherein the source region is formed on the first well region, and the drain region is formed on the second well region.

14. The method of claim 13, further comprising:
forming a buried layer having a circular ring shape on the substrate, the buried layer having a same conductivity type as the upper drift layer; and
forming a deep well region having a circular ring shape on the buried layer, the deep well region having a same conductivity type as the upper drift layer,
wherein the first well region is formed on the deep well region.

15. The method of claim 14, wherein the buried layer is formed by an ion implantation process using an ion implantation mask,
the ion implantation mask has a plurality of openings arranged in a circular ring shape, and
the openings have a width that gradually decreases in an inward direction.

16. The method of claim 13, further comprising:
forming a first buried layer having a circular ring shape on the substrate, the first buried layer having a same conductivity type as the upper drift layer;
forming a second buried layer having a circular ring shape inside the first buried layer, the second buried layer having a same conductivity type as the upper drift layer; and
forming a deep well region having a circular ring shape on the first buried layer, the deep well region having a same conductivity type as the upper drift layer,
wherein the first well region is formed on the deep well region, and the second buried layer has an impurity concentration lower than that of the first buried layer.

17. The method of claim 12, further comprising forming a first field electrode having a circular ring shape on the field insulating layer.

18. The method of claim 17, further comprising:
forming a plurality of second field electrodes on the field insulating layer, the plurality of second field electrodes having a circular ring shape surrounding the first field electrode and arranged in a concentric circle shape,
wherein the first field electrode is electrically connected to the drain region and the second field electrodes are electrically floated.

* * * * *